(12) United States Patent
Chen et al.

(10) Patent No.: US 9,933,678 B1
(45) Date of Patent: Apr. 3, 2018

(54) ACTIVE ELEMENT ARRAY SUBSTRATE AND DISPLAY PANEL USING THE SAME

(71) Applicant: AU Optronics Corporation, Hsin-Chu (TW)

(72) Inventors: Yi-Jung Chen, Hsin-Chu (TW);
Shang-Jie Wu, Hsin-Chu (TW);
Sheng-Ju Ho, Hsin-Chu (TW);
Wen-Tsan Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/651,054

(22) Filed: Jul. 17, 2017

(30) Foreign Application Priority Data

Dec. 28, 2016 (TW) .............................. 105143686 A

(51) Int. Cl.
*H01L 27/12* (2006.01)
*H01L 27/15* (2006.01)
*G02F 1/1343* (2006.01)
*G02F 1/1337* (2006.01)
*G02F 1/1368* (2006.01)
(Continued)

(52) U.S. Cl.
CPC .......... *G02F 1/1368* (2013.01); *G02F 1/1337* (2013.01); *G02F 1/1339* (2013.01); *G02F 1/1362* (2013.01); *G02F 1/167* (2013.01); *G06F 3/041* (2013.01); *G09G 3/36* (2013.01); *H01L 21/042* (2013.01); *H01L 21/82* (2013.01);
(Continued)

(58) Field of Classification Search
CPC ....... H01L 27/02; H01L 27/14; H01L 27/124; H01L 21/042; H01L 21/82; G02F 1/1368; G02F 1/1337; G02F 1/1339; G02F 1/1362; G02F 1/167; G06F 3/041; G09G 3/36
USPC ............ 257/43, 59, 72, 88, 89, 99, E27.081, 257/E27.084, E27.111, E29.003, E29.137, 257/E29.296, E33.004, E33.053, E33.062; 345/87, 89, 92, 204, 211; 349/38, 41, 42, 349/43, 106, 143; 438/30, 152, 155, 255
See application file for complete search history.

(56) References Cited

U.S. PATENT DOCUMENTS

| 7,936,323 B2 | 5/2011 | Mori et al. |
| 8,779,436 B2 * | 7/2014 | Chen ........................ G09G 3/32 257/59 |

(Continued)

FOREIGN PATENT DOCUMENTS

CN 103135295 A 6/2013

*Primary Examiner* — Dao H Nguyen
(74) *Attorney, Agent, or Firm* — WPAT, PC

(57) ABSTRACT

An active element array substrate includes a substrate, first to third data lines extending along a first direction, first and second scan lines and a common electrode line extending along a second direction, and first to third sub-pixel units that are provided on the substrate. The first and third data lines respectively intersect with first and second adjacent ones of the first scan lines to define a pixel region. The second data line is located between the first and third data lines and passes through the pixel region. The first data line intersects with the second scan line and the common electrode line to define a plurality of sub-pixel regions in the pixel region. The first to third sub-pixel units are respectively provided in the sub-pixel regions and respectively electrically connected to the first data line and the first one of the first scan lines, the second data line and the second scan line, and the third data line and the second scan line.

15 Claims, 6 Drawing Sheets

(51) Int. Cl.
*G02F 1/167* (2006.01)
*H01L 21/82* (2006.01)
*H01L 27/02* (2006.01)
*G06F 3/041* (2006.01)
*G02F 1/1362* (2006.01)
*G09G 3/36* (2006.01)
*H01L 27/14* (2006.01)
*H01L 21/04* (2006.01)
*G02F 1/1339* (2006.01)

(52) U.S. Cl.
CPC ............ *H01L 27/02* (2013.01); *H01L 27/124* (2013.01); *H01L 27/14* (2013.01)

(56) References Cited

U.S. PATENT DOCUMENTS

| | | | |
|---|---|---|---|
| 2005/0134783 A1* | 6/2005 | Park | G02F 1/134363 349/141 |
| 2011/0156993 A1* | 6/2011 | Ting | G02F 1/133707 345/87 |
| 2011/0157121 A1* | 6/2011 | Chan | G02F 1/13624 345/211 |
| 2012/0249492 A1 | 10/2012 | Kim et al. | |
| 2014/0078032 A1 | 3/2014 | Xia et al. | |
| 2016/0327824 A1* | 11/2016 | Chen | G02F 1/13394 |
| 2016/0342041 A1* | 11/2016 | Daishi | G02F 1/134309 |

\* cited by examiner

ACTIVE ELEMENT ARRAY SUBSTRATE
AND DISPLAY PANEL USING THE SAME

BACKGROUND

Technical Field

The present invention relates to an active element array substrate and a display panel using the same.

Related Art

With the development of display technologies, liquid crystal display apparatuses have been widely applied in various electronic devices. In a process of manufacturing a liquid crystal display apparatus, preset positions of upper and lower substrates need to be adhered to form each pixel.

However, in some cases, the upper and lower substrates are easily dislocated. By using a curved liquid crystal display apparatus as an example, generally, a display apparatus is first formed into a flat structure, and then the liquid crystal display apparatus in the flat structure is bent to obtain the curved liquid crystal display apparatus. When the liquid crystal display apparatus in the flat structure is greatly bent, because substrates are greatly moved relative to each other, consequently, preset corresponding positions, on a bent part, of the substrates are dislocated, and a phenomenon of disordered liquid crystal arrangement occurs in a dislocated part, and consequently, visual effects are affected.

SUMMARY

Some implementation manners of the present invention provide an active element array substrate and a display panel using the same. A long edge of a sub-pixel is designed to be parallel to an extension direction of a display panel, so that a region in which liquid crystal arrangement is disordered because upper and lower substrates are dislocated is reduced. In addition, in the present implementation manner, a first sub-pixel unit, a second sub-pixel unit, and a third sub-pixel unit are supplied by means of a same gate signal and different data signals, so that the first sub-pixel unit, the second sub-pixel unit, and the third sub-pixel unit have respective operating voltages, and present respective expected brightnesses. This practice may improve power supply time of each sub-pixel unit to ensure that an active element in each sub-pixel unit is sufficiently charged.

According to some implementation manners of the present invention, an active element array substrate comprises a substrate, at least one first data line, at least one second data line, at least one third data line, a plurality of first scan lines, at least one second scan line, at least one common electrode line, at least one first sub-pixel unit, at least one second sub-pixel unit, and at least one third sub-pixel unit. The substrate comprises an active region and a peripheral region provided on at least one side of the active region. The first data line, the second data line, and the third data line extend along a first direction and are provided on the substrate. The first scan lines extend along a second direction and are provided on the substrate, wherein the first direction is not parallel to the second direction; the first data line and the third data line respectively intersect with first and second adjacent ones of the first scan lines to define at least one pixel region in the active region on the substrate. The second data line is located between the first data line and the third data line and passes through the pixel region. The second scan line and the common electrode line extend along the second direction and are provided on the substrate, wherein the first data line intersects with the second scan line and the common electrode line to define a first sub-pixel region, a second sub-pixel region, and a third sub-pixel region in the pixel region. The first sub-pixel unit is provided in the first sub-pixel region and electrically connected to the first data line and the first one of the first scan lines. The second sub-pixel unit is provided in the second sub-pixel region and electrically connected to the second data line and the second scan line. The third sub-pixel unit is provided in the third sub-pixel region and electrically connected to the third data line and the second scan line.

In some implementation manners of the present invention, each of the first sub-pixel region, the second sub-pixel region, and the third sub-pixel region has a first length in the first direction and has a second length in the second direction, and the first length is less than the second length.

In some implementation manners of the present invention, the first scan lines and the second scan line extend to the peripheral region, and the first one of the first scan lines is electrically connected to the second scan line.

In some implementation manners of the present invention, the active element array substrate further comprises a gate driver, located in the peripheral region of the substrate, wherein the gate driver comprises at least one pin, and the first one of the first scan lines and the second scan line are electrically connected to the same pin.

In some implementation manners of the present invention, each of the first sub-pixel unit, the second sub-pixel unit, and the third sub-pixel unit comprises an active element and at least one pixel electrode, and the pixel electrode is electrically connected to the active element, and the pixel electrode comprises a first trunk electrode and a plurality of branch electrodes. The first trunk electrode extends along the second direction. The branch electrodes are electrically connected to the first trunk electrode and extend towards a plurality of different extension directions, wherein the extension directions are not parallel to the first direction and the second direction.

In some implementation manners of the present invention, the pixel electrode further comprises a second trunk electrode, which extends along the first direction and intersects with the first trunk electrode.

In some implementation manners of the present invention, the second data line intersects with the first one of the first scan lines to define a first divided region and a second divided region of each of the first sub-pixel region, the second sub-pixel region, and the third sub-pixel region; there are two pixel electrodes in each of the first sub-pixel unit, the second sub-pixel unit, and the third sub-pixel unit; the pixel electrodes are respectively located in the first divided region and the second divided region; each of the first sub-pixel unit, the second sub-pixel unit, and the third sub-pixel unit comprises a connection electrode to be electrically connected to the pixel electrodes respectively located in the first divided region and the second divided region.

In some implementation manners of the present invention, the branch electrodes of each of the pixel electrodes have two of the extension directions.

In some implementation manners of the present invention, the branch electrodes of each of the pixel electrodes have four of the extension directions.

In some implementation manners of the present invention, each of the first sub-pixel unit, the second sub-pixel unit, and the third sub-pixel unit comprises an active element and a pixel electrode, and the pixel electrode is electrically connected to the active element, and the active element array substrate further comprises a color filter and a light shielding layer. The color filter comprises a red photoresist, a blue photoresist, and a green photoresist. The red photoresist is provided corresponding to the pixel electrode of the first sub-pixel region. The blue photoresist is provided corresponding to the pixel electrode of the second sub-pixel region. The green photoresist is provided corresponding to the pixel electrode of the third sub-pixel region. The light shielding layer covers the active element.

According to some implementation manners of the present invention, a display panel comprises the foregoing active element array substrate, an opposite substrate, a liquid crystal layer, and two vertical alignment layers. The liquid crystal layer is provided between the active element array substrate and the opposite substrate. The vertical alignment layers are respectively provided between the liquid crystal layer and the active element array substrate and between the liquid crystal layer and the opposite substrate.

In some implementation manners of the present invention, the vertical alignment layers are formed by polymer stabilized materials.

In some implementation manners of the present invention, each of the first sub-pixel unit, the second sub-pixel unit, and the third sub-pixel unit comprises an active element and a pixel electrode, and the pixel electrode is electrically connected to the active element, and the active element array substrate further comprises a color filter, a light shielding layer, and at least one spacer. The color filter is provided corresponding to the pixel electrode. The light shielding layer is provided corresponding to the active element. The spacer is provided on the color filter, wherein a top end of the spacer is connected to the opposite substrate.

In some implementation manners of the present invention, the substrate of the active element array substrate and the opposite substrate bend along the second direction.

In some implementation manners of the present invention, each of the first sub-pixel region, the second sub-pixel region, and the third sub-pixel region has a first length in the first direction and has a second length in the second direction, and the first length is less than the second length.

DETAILED DESCRIPTION

Figure 1A:
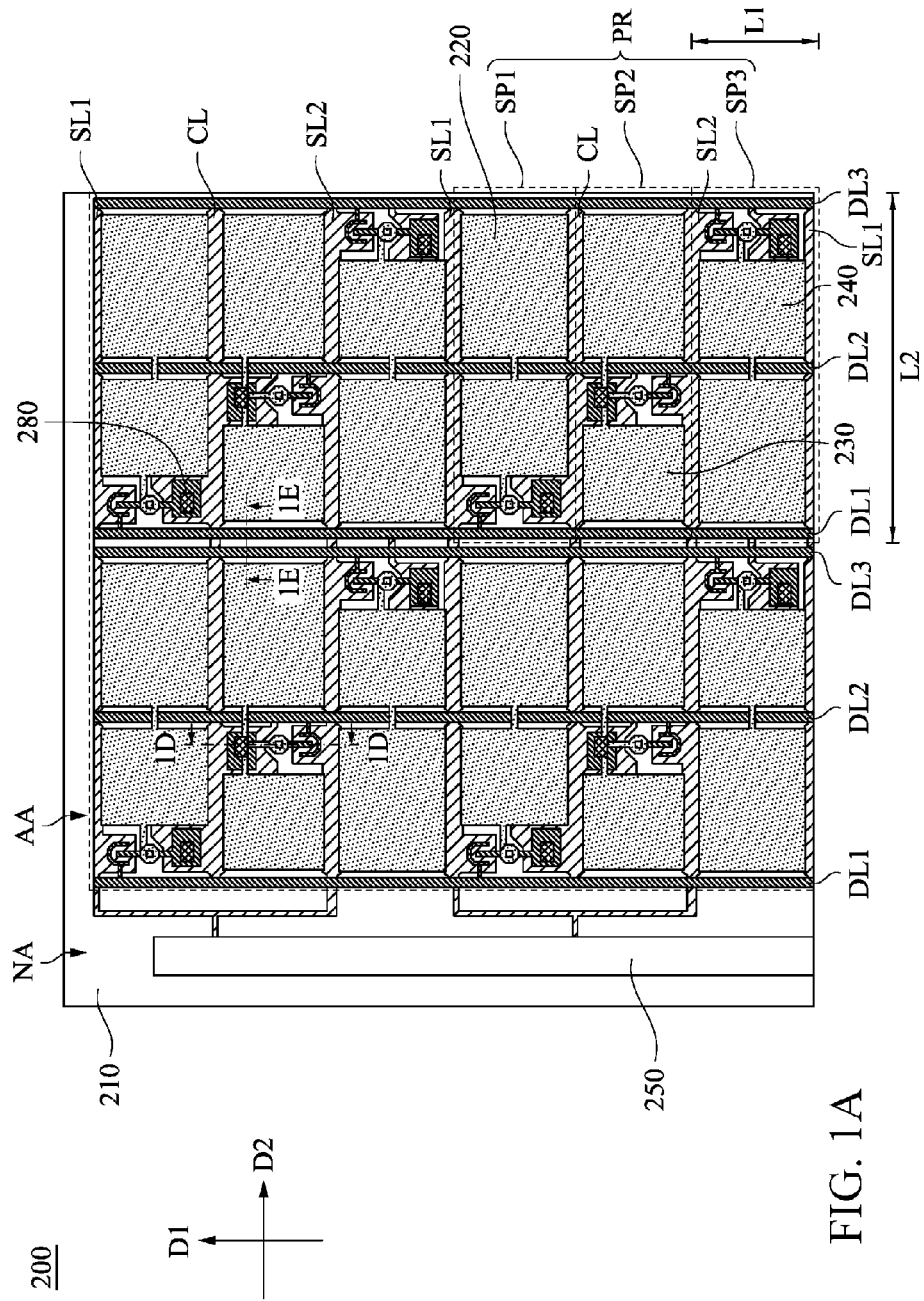
FIG. 1A is a schematic top view of an active element array substrate according to an implementation manner of the present invention.

A plurality of implementation manners of the present invention will be disclosed below with accompanying drawings. For description clearness, a lot of practical details will be described together in the following description. However, it should be known that the practical details should not be intended to limit the present invention. That is, in some implementation manners of the present invention, the practical details are unnecessary. In addition, to simplify drawings, some conventional structures and elements are drawn in a simple illustrative manner in the drawings.

FIG. 1A is a schematic top view of an active element array substrate 200 according to an implementation manner of the present invention. The active element array substrate 200 comprises a substrate 210, which comprises an active region AA and a peripheral region NA provided on at least one side of the active region AA. The active element array substrate 200 comprises at least one first data line DL1, at least one second data line DL2, at least one third data line DL3, a plurality of first scan lines SL1, at least one second scan lines SL2, at least one common electrode line CL, at least one first sub-pixel unit 220, at least one second sub-pixel unit 230, and at least one third sub-pixel unit 240 that are provided on the substrate 210.

In some implementation manners of the present invention, the first data line DL1, the second data line DL2, and the third data line DL3 extend along a first direction D1 and are sequentially arranged, so that the second data line DL2 is provided between the first data line DL1 and the third data line DL3. The first scan lines SL1, the common electrode line CL, and the second scan line SL2 extend along a second direction D2 and are sequentially arranged, so that the common electrode line CL is provided between the first scan lines SL1 and the second scan line SL2. The first direction D1 is not parallel to the second direction D2. In some implementation manners, every adjacent two scan lines SL1 respectively intersect with the first data line DL1 and the third data line DL3 to define a pixel region PR in the active region AA on the substrate 210. The second data line DL2 passes through the pixel region PR. Herein, a plurality of pixel regions PR arranged in an array is provided on the substrate 210.

In other words, in the foregoing implementation manner of the present invention, the pixel region PR is formed by adjacent two first scan lines SL1, one first data line DL1, and one third data line DL3 intersecting with each other. In addition, the foregoing common electrode line CL intersects with the first data line DL1 and the third data line DL3, and one first scan line SL1, the first data line DL1, and the third data line DL3 in the pixel region PR and the common electrode line CL define a first sub-pixel region SP1 in the pixel region PR. The second scan line SL2 intersects with the first data line DL1 and the third data line DL3, and the first data line DL1, the third data line DL3, the common electrode line CL, and the second scan line SL2 define a second sub-pixel region SP2 in the pixel region PR. Then, the other first scan line SL1, the first data line DL1, and the third data line DL3 in the pixel region PR and the second scan line SL2 define a third sub-pixel region SP3 in the pixel region PR.

The first sub-pixel unit 220 is provided in the first sub-pixel region SP1 and electrically connected to the first data line DL1 and one of the first scan lines SL1. The second sub-pixel unit 230 is provided in the second sub-pixel region SP2 and electrically connected to the second data line DL2 and the second scan line SL2. The third sub-pixel unit 240 is provided in the third sub-pixel region SP3 and electrically connected to the third data line DL3 and the second scan line SL2.

In some implementation manners of the present invention, the first scan lines SL1 and the second scan line SL2 extend to the peripheral region NA; in a same pixel region PR, the first scan line SL1 electrically connected to the first sub-pixel unit 220 is electrically connected to the second scan line SL2 electrically connected to the second sub-pixel unit 230 and the third sub-pixel unit 240. Specifically, the active element array substrate 200 further comprises a gate driver 250, located in the peripheral region NA of the substrate 210. For example, the data driver 250 may be a drive chip. Or, the gate driver 250 may also be a suitable drive circuit. The gate driver 250 comprises at least one pin, wherein the first scan lines SL1 in a same pixel region PR and the second scan line SL2 are electrically connected to a same pin. In this way, the first sub-pixel unit 220, the second sub-pixel unit 230, and the third sub-pixel unit 240 may be supplied with respective operating voltages at the same time by means of a same gate signal and different data signals (the first data line DL1, the second data line DL2, and the third data line DL3) to present expected brightnesses. In the present implementation manner, because a plurality of gate signals is not supplied to a same pixel region PR by means of time division, in view of this, power supply time of each sub-pixel unit can be improved to ensure that an active element of each sub-pixel unit is sufficiently charged. In addition, compared with an operating manner of controlling each sub-pixel unit in a same pixel unit to operate by using a plurality of gate lines in cooperation with one data line, the present implementation manner controls each sub-pixel unit in a same pixel unit to operate by using one gate line in cooperation with a plurality of data lines, and therefore a quantity of pins needed by the gate driver 250 can be further reduced, and because the quantity of pins is reduced, charging time of a gate can be extended, so as to improve an effect of dynamic display that can be received by human eyes.

Although it is not drawn in detail herein, in some implementation manners, the substrate 210 may bend along the second direction D2 (that is, the first direction D1 is used a direction of an axis). Further, to match human visual effects, the second direction D2 along which the substrate 210 bends is a direction of left and right sides that can be observed by eyes of a user. Herein, although the complete substrate 210 is not drawn, a length of the substrate 210 in the first direction D1 may be designed to be less than a length of the substrate 210 in the second direction D2, and the user can sense an obvious curved display effect on the left and right sides (that is, in the second direction D2).

Figure 1B:
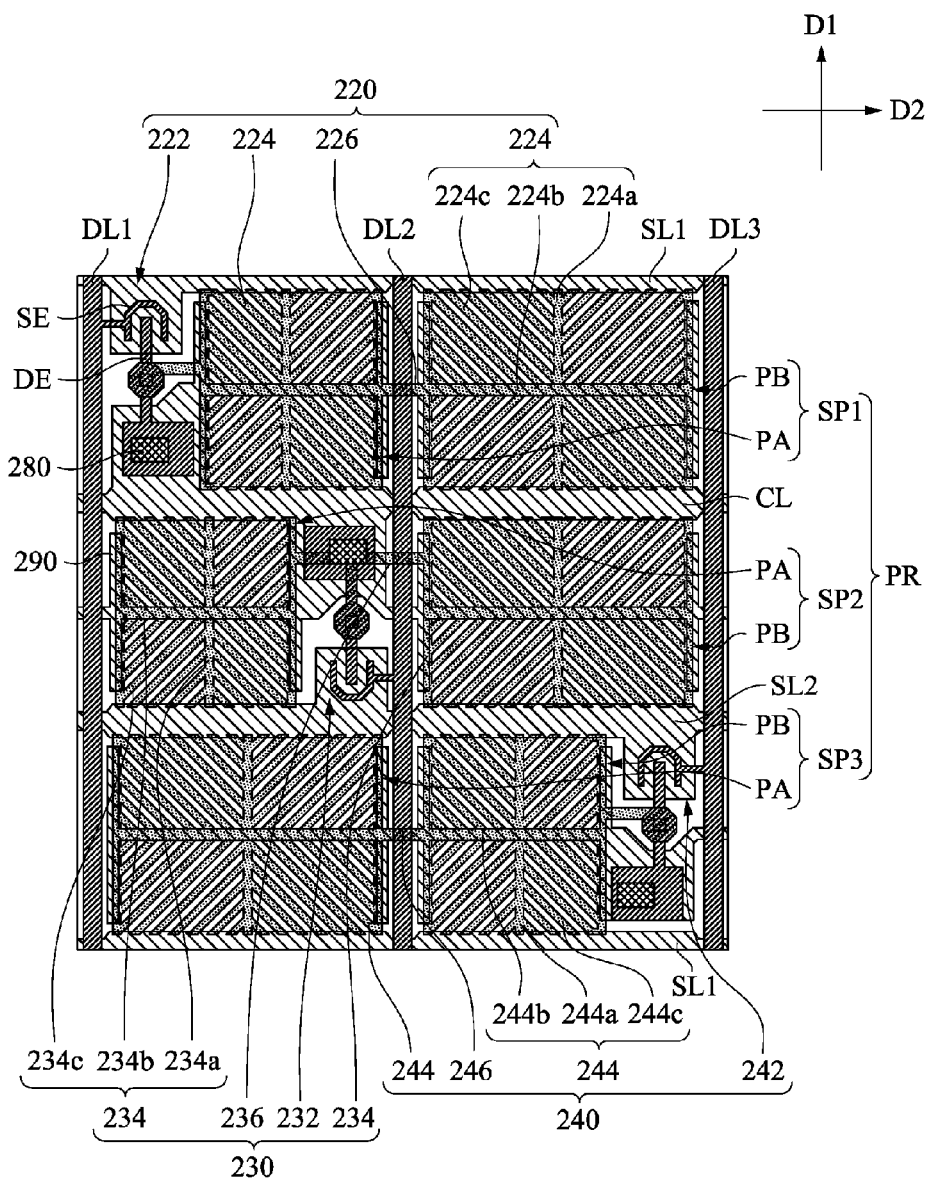
FIG. 1B is a schematic top view of a single pixel region of FIG. 1A.

FIG. 1B is a schematic top view of a single pixel region PR of FIG. 1A. Refer to FIG. 1B and FIG. 1A at the same time. In some implementation manners of the present invention, the first sub-pixel unit 220 comprises an active element 222 and at least one pixel electrode 224, wherein the pixel electrode 224 is electrically connected to the active element 222. The pixel electrode 224 may selectively comprise a first trunk electrode 224a, a second trunk electrode 224b, and a plurality of branch electrodes 224c. The first trunk electrode 224a extends along the first direction D1. The second trunk electrode 224b extends along the second direction D2 and intersects with the first trunk electrode 224a. The branch electrodes 224c are electrically connected to the first trunk electrode 224a or the second trunk electrode 224b and extend towards a plurality of different extension directions, and the extension directions of the branch electrodes 224c are not parallel to the first direction D1 and the second direction D2.

Similarly, the second sub-pixel unit 230 comprises an active element 232 and at least one pixel electrode 234, wherein the pixel electrode 234 is electrically connected to the active element 232. The pixel electrode 234 may selectively comprise a first trunk electrode 234a, a second trunk electrode 234b, and a plurality of branch electrodes 234c. The first trunk electrode 234a extends along the first direction D1. The second trunk electrode 234b extends along the second direction D2 and intersects with the first trunk electrode 234a. The branch electrodes 234c are electrically connected to the first trunk electrode 234a or the second trunk electrode 234b and extend towards a plurality of different extension directions, and the extension directions of the branch electrodes 234c are not parallel to the first direction D1 and the second direction D2.

Similarly, the third sub-pixel unit 240 comprises an active element 242 and at least one pixel electrode 244. The pixel electrode 244 is electrically connected to the active element 242, and may selectively comprise a first trunk electrode 244a, a second trunk electrode 244b, and a plurality of branch electrodes 244c. The first trunk electrode 244a extends along the first direction D1. The second trunk electrode 244b extends along the second direction D2 and intersects with the first trunk electrode 244a. The branch electrodes 244c are electrically connected to the first trunk electrode 244a or the second trunk electrode 244b and extend towards a plurality of different extension directions, and the extension directions of the branch electrodes 244c are not parallel to the first direction D1 and the second direction D2.

Herein, the first trunk electrodes 224a, 234a, and 244a are respectively provided with the branch electrodes 224c, 234c, and 244c connected thereto along two sides of the second direction D2, and the second trunk electrodes 224b, 234b, and 244b are respectively provided with the branch electrodes 224c, 234c, and 244c connected thereto along two sides of the first direction D1. In the present implementation manner, the branch electrodes 224c, 234c, and 244c of the pixel electrodes 224, 234, and 244 have four extension directions, so as to effectively divide liquid crystal arrangement into a plurality of domains.

In some implementation manners of the present invention, there are two pixel electrodes 224 of the first sub-pixel unit 220, and the first sub-pixel unit 220 comprises a connection electrode 226 to be electrically connected to the two pixel electrodes 224. Herein, the second data line DL2 intersects with the first scan lines SL1, and the second data line DL2 intersects with the common electrode line CL, to divide the first sub-pixel region SP1 into a first divided region PA and a second divided region PB. The two pixel electrodes 224 are respectively located in the first divided region PA and the second divided region PB.

Similarly, there are two pixel electrodes 234 of the second sub-pixel unit 230, and the second sub-pixel unit 230 comprises a connection electrode 236 to be electrically connected to the two pixel electrodes 234. Herein, the second data line DL2 intersects with the common electrode line CL, and the second data line DL2 intersects with the second scan line SL2, to divide the second sub-pixel region SP2 into a first divided region PA and a second divided region PB. The two pixel electrodes 234 are respectively located in the first divided region PA and the second divided region PB.

Similarly, there are two pixel electrodes 244 of the third sub-pixel unit 240, and the third sub-pixel unit 240 comprises a connection electrode 246 to be electrically connected to the two pixel electrodes 244. Herein, the second data line DL2 intersects with the second scan line SL2, and the second data line DL2 intersects with a next first scan line SL1, to divide the third sub-pixel region SP3 into a first divided region PA and a second divided region PB. The two pixel electrodes 244 are respectively located in the first divided region PA and the second divided region PB. In some implementation manners of the present invention, the first trunk electrodes 224a, 234a, and 244a of the pixel electrodes 224, 234, and 244 are approximately located in the center of the first divided region PA and the second divided region PB thereof.

When the active element array substrate 200 is applied to a curved display panel, an alignment layer of upper and lower substrates of the display panel provides a plurality of definition domains. Because alignment directions of the definition domains are different, when the upper and lower substrates are dislocated after bending, a dislocated region is easily generated on an edge of the definition domains, and a black feather phenomenon occurs. For example, the black feather phenomenon may occur on one side of the first trunk electrodes 224a, 234a, and 244a or one side of the first divided region PA and the second divided region PB.

In some implementation manners of the present invention, each of the first sub-pixel region SP1, the second sub-pixel region SP2, and the third sub-pixel region SP3 has a first length L1 in the first direction D1 and has a second length L2 in the second direction D2, and the first length L1 is less than the second length L2. That is, the first sub-pixel region SP1, the second sub-pixel region SP2, and the third sub-pixel region SP3 extend along the second direction D2. In this way, an area of the dislocated region may be reduced, and the black feather phenomenon may be improved.

For example, in the present implementation manner, quantities of the pixel electrodes 224, 234, and 244 are two. In this case, a sum of lengths of two second trunk electrodes 224b of the two pixel electrodes 224 may be designed to be greater than a sum of lengths of two first trunk electrodes 224a of the two pixel electrodes 224; a sum of lengths of two second trunk electrodes 234b of the two pixel electrodes 234 is greater than a sum of lengths of two first trunk electrodes 234a of the two pixel electrodes 234; and a sum of lengths of two second trunk electrodes 244b of the two pixel electrodes 244 is greater than a sum of lengths of two first trunk electrodes 244a of the two pixel electrodes 244. In this way, even though when the substrate 210 bends along the second direction D2 and the black feather phenomenon may occur on a periphery of the first trunk electrodes 224a, 234a, and 244a due to dislocation, in view of that a length of a sum of the first trunk electrodes 224a, 234a, and 244a is less than a length of a sum of the second trunk electrodes 224b, 234b, and 244b, compared with configuration that pixel electrodes extend longitudinally, the configuration of the present implementation manner can reduce an area of the dislocated region, to reduce an effect of the black feature phenomenon on visual effects. In other implementation manners, quantities of the pixel electrodes 224, 234, and 244 can be selectively set, and are not limited to what shown in the drawings.

In other implementation manners, quantities of the pixel electrodes 224, 234, and 244 may be set as one, and lengths of the second trunk electrodes 224b, 234b, and 244b of the pixel electrodes 224, 234, and 244 are greater than lengths of the first trunk electrodes 224a, 234a, and 244a.

On the other aspect, in some implementation manners of the present invention, the first sub-pixel unit 220, the second sub-pixel unit 230, and the third sub-pixel unit 240 may comprise a shield electrode 290, which is designed to shield a dislocated region on one side of the first divided region PA and the second divided region PB, to reduce the black feature phenomenon and protect the visual effects. In addition, the shield electrode 290 may further be provided below the second trunk electrodes 224b, 234b, and 244b, to connect segments (not marked) of the shield electrode in a case of not affecting visual effects. There is a plurality of possibilities for configuration of the shield electrode 290, and the scope of the present invention should not be limited to what drawn in the drawings. For convenience of drawing, the shield electrode 290 is not drawn in FIG. 1A.

Herein, distances among the first scan lines SL1, the second scan line SL2, and the common electrode line CL are approximately the same, so that widths of the first sub-pixel region SP1, the second sub-pixel region SP2, and the third sub-pixel region SP3 are approximately the same, but the scope of the present invention should not be limited thereto. In some implementation manners, distances among the first scan lines SL1, the second scan line SL2, and the common electrode line CL may be different to match various pixel structural designs.

Figure 1C:
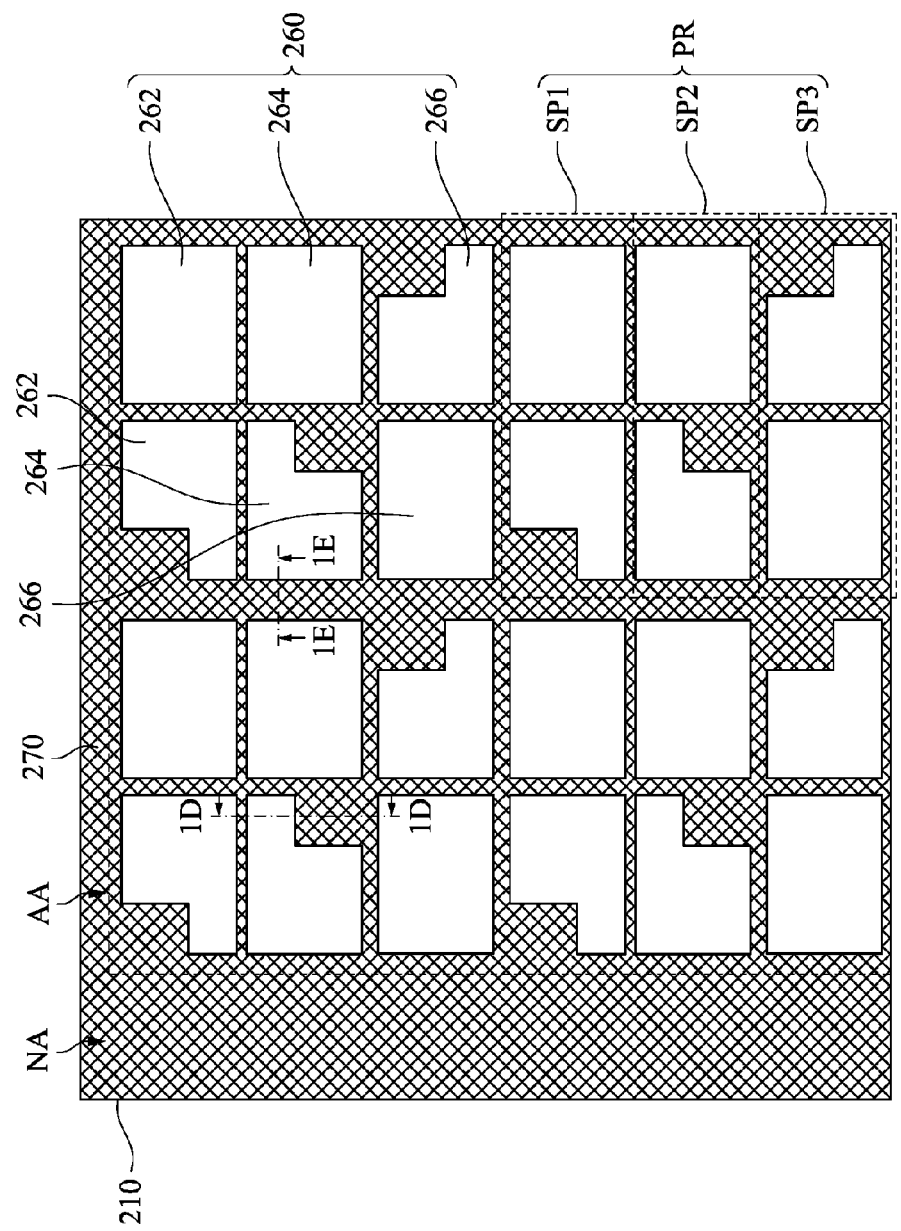
FIG. 1C is a schematic top view of a color filter and a light shielding layer of some implementation manners of the present invention.

FIG. 1C is a schematic top view of a color filter 260 and a light shielding layer 270 of some implementation manners of the present invention. Refer to FIG. 1A and FIG. 1C at the same time. In some implementation manners of the present invention, the active element array substrate 200 may comprise the color filter 260 and the light shielding layer 270. The color filter 260 is provided corresponding to the pixel electrodes 224, 234, and 244. The light shielding layer 270 defines the foregoing active region AA and peripheral region NA. The light shielding layer 270 may be a single-layer or a multi-layer structure, and a material thereof may be a black matrix, a material stacked by at least two color photoresists with different colors, or another suitable material, and can be formed by means of ink printing or exposure and development.

In some implementation manners of the present invention, the color filter 260 comprises a red photoresist 262, a green photoresist 264, and a blue photoresist 266. The red photoresist 262 is provided corresponding to the first sub-pixel region SP1. The green photoresist 264 is provided corresponding to the second sub-pixel region SP2. The blue photoresist 266 is provided corresponding to the third sub-pixel region SP3. In this way, a color of light that passes through the pixel region PR can be controlled. Certainly, the scope of the present invention should not be limited to the color sequence. In other implementation manners, it may be set that the blue photoresist corresponds to the first sub-pixel region SP1, the green photoresist corresponds to the second sub-pixel region SP2, and the red photoresist corresponds to the third sub-pixel region SP3. Herein, the light shielding layer 270 may cover the active elements 222, 232, and 242, the first data line DL1, the second data line DL2, the third data line DL3, and capacitors (not marked) connected to the active elements. In some embodiments, the light shielding layer 270 may selectively cover the common electrode line CL.

Herein, by using a color filter on array (COA) technology, that is, providing the color filter 260 and the light shielding layer 270 on the active element array substrate 200, the problem that a conventional color filter substrate is not easily aligned with an active element array substrate can be improved. Certainly, the present invention should not be limited thereto. In other implementation manners of the present invention, the color filter 260 and the light shielding layer 270 may still be provided on the opposite substrate 300 (referring to FIG. 1D first). In other words, the color filter 260 and the light shielding layer 270 may not be provided on the active element array substrate 200.

Figure 1D:
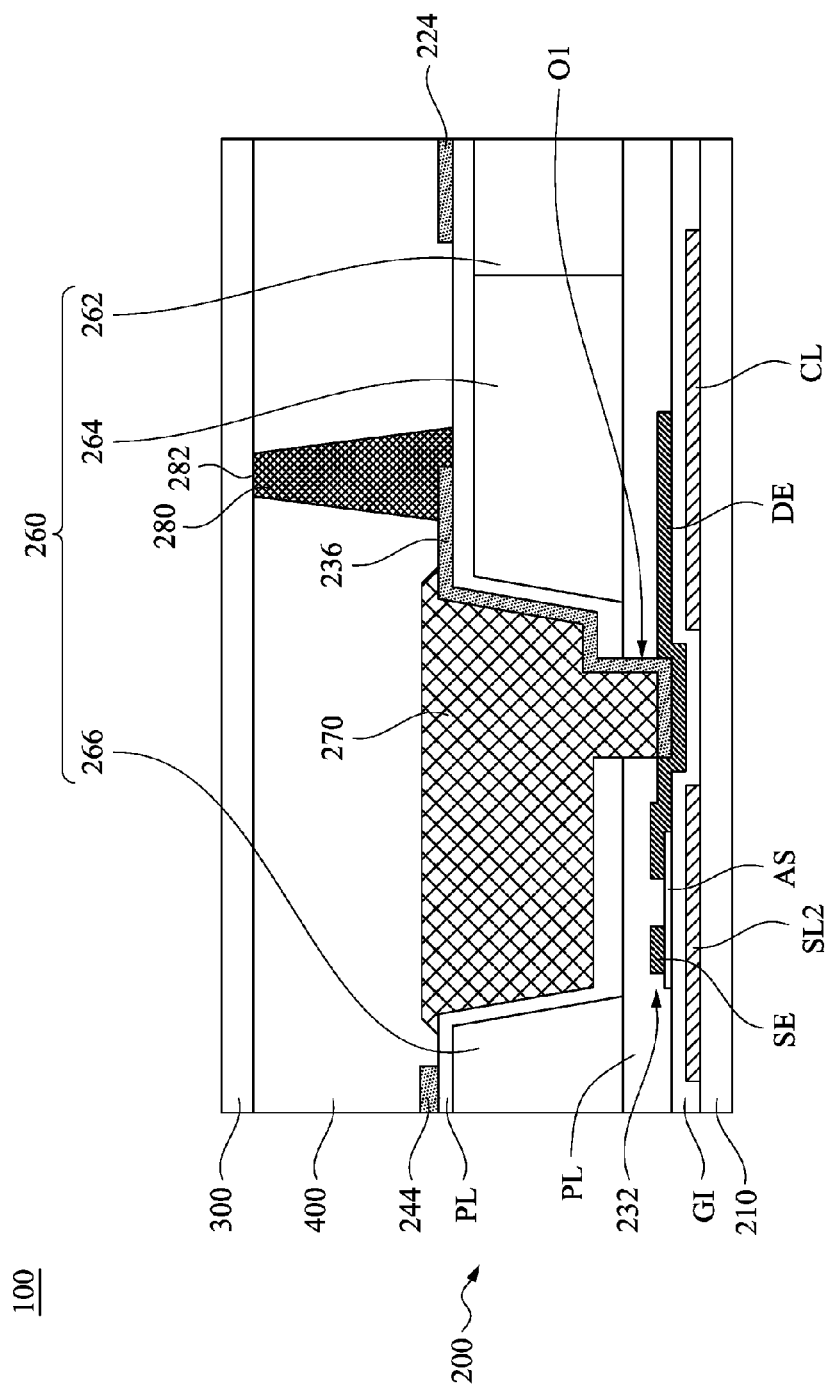
FIG. 1D is a schematic sectional view along a line 1D-1D of FIG. 1A.

FIG. 1D is a schematic sectional view along a line 1D-1D of FIG. 1A and FIG. 1C. Refer to FIG. 1A, FIG. 1C, and FIG. 1D at the same time. The active element array substrate 200 may be applied to a display panel 100. Specifically, the display panel 100 comprises an active element array substrate 200, an opposite substrate 300, a liquid crystal layer 400, and an alignment layer (for example, a vertical alignment layer, not drawn). The liquid crystal layer 400 is provided between the active element array substrate 200 and the opposite substrate 300. The alignment layer (for example, a vertical alignment layer, not drawn) is respectively provided between the liquid crystal layer 400 and the active element array substrate 200 and between the liquid crystal layer 400 and the opposite substrate 300. In the present implementation manner, the active element array substrate 200 further comprises at least one spacer 280, which is provided on the color filter 260, wherein a top end 282 of the spacer 280 is connected to the opposite substrate 300 to support/maintain a height of the liquid crystal layer 400.

The active element 232 comprises a semiconductor layer AS, a gate (that is, the second scan line SL2 marked in the drawing), a gate dielectric layer GI, and a drain DE and a source SE that are connected to two ends of the semiconductor layer AS. The gate dielectric layer GI is provided between the gate and the semiconductor layer AS of the active element 232. The gate of the active element 232 is electrically connected to scan lines. The source SE of the active element 232 is electrically connected to the second data line DL2. The drain DE of the active element 232 is electrically connected to the connection electrode 236 and the pixel electrode 234 by means of an opening O1 of an insulation layer PL (referring to FIG. 1A and FIG. 1B). The light shielding layer 270 may be filled into the opening O1 of the insulation layer PL to shield non-ideal light.

In some implementation manners of the present invention, the drain DE of the active element 232 is at least partially overlapping with the common electrode line CL, so as to generate capacitance to maintain a potential of the drain DE. A part in which the drain DE is overlapping with the common electrode line CL may be overlapping with the spacer 280, so as to reduce a range in which light cannot pass through, thereby improving an aperture opening ratio. It is further described that overlapping in this embodiment of the present invention, for example, refers to overlapping in a vertical projection direction. In addition, although it is not described in detail, configurations of the active elements 222 and 242 are substantively approximately the same as that of the active element 232, and details are not described herein again.

In some implementation manners of the present invention, the active elements 222, 232, and 242 may be various semiconductor elements, for example, transistors, diodes, or other suitable elements, and materials of the semiconductor elements include polysilicon, monocrystalline silicon, microcrystalline silicon, amorphous silicon, carbon nanotubes/nanorods, organic semiconductor materials, metal oxide semiconductor materials, other suitable materials, or a combination of at least two of the foregoing materials. If the active elements 222, 232, and 242 of the present invention are transistors, they may be bottom gate transistors (for example, the gate is located below the semiconductor layer AS), top gate transistors (for example, the gate is located above the semiconductor layer AS), multi-dimensional channel transistors (for example, a carrier flowing path of the semiconductor layer AS includes two directions (for example, a horizontal direction and a non-horizontal direction)), stereoscopic transistors (for example, at least two of the gate, the source SE, and the drain DE are respectively located on different horizontal planes), or other suitable transistors.

Herein, the display panel 100 may use a multi-domain vertical alignment (MVA) technology. Specifically, an alignment layer (for example, a vertical alignment film, not marked) is provided above and below the liquid crystal layer 400. The alignment layer (for example, a vertical alignment film, not marked) may provide alignment force (for example, vertical alignment force) for liquid crystal molecules, and an electrode may further be matched to provide a plurality of pretilt angles with different definition domains, so that the liquid crystal layer 400 may comprise a plurality of definition domains to achieve the MVA technology. For example, the vertical alignment layer may be formed by a polymer stabilized material. Ideally, upper and lower vertical alignment layers in any region of the liquid crystal layer 400 have a same alignment direction. However, actually, upper and lower vertical alignment layers in some regions of the liquid crystal layer 400 have different alignment directions, that is, the dislocated region in the text. Certainly, the scope of the present invention should not be limited to the MVA technology, and in other implementation manners, display panels 100 of other types may also be used.

In some implementation manners of the present invention, the display panel 100 may be a curved display panel, for example, the opposite substrate 300 and the active element array substrate 200 both bend towards a particular direction. Or, in other implementation manners, the display panel 100 may be a flat display panel.

In some implementation manners of the present invention, a material of one of the substrate 210 of the active element array substrate 200 and the opposite substrate 300 may include glass, quartz, a polymer material (for example, polyimide (PI), benzocyclobutene (BCB), polycarbonate (PC), or another suitable material), another suitable material, or a combination of the foregoing at least two materials. A material of a display dielectric layer includes a self-luminescent material (for example, an organic luminescent material, an inorganic luminescent material, another suitable material, or a combination of the foregoing materials) or a non self-luminescent material (for example, a liquid crystal material, an electrophoresis material, an electrowetting material, another suitable material, or a combination of the foregoing materials).

The insulation layer PL and the gate dielectric layer GI may be single-layer or multi-layer structures, and materials thereof include (for example, silicon oxide, silicon nitride, silicon oxynitride, or other suitable materials), organic materials (for example, photoresists, PI, BCB, or other suitable materials), or other suitable materials.

In some implementation manners of the present invention, the data lines DL1 to DL3, the scan lines SL1 to SL2 and the common electrode line CL may be various materials with good conductivity, for example, metals, alloys, conductive adhesives, other suitable materials, or a combination of the foregoing at least two materials. The pixel electrodes 224 to 244 and the connection electrodes 226 to 246 may be formed by patterning a same material layer, wherein the material layer may be formed by various materials with good conductivity and transparency, for example, indium tin oxide. In other embodiments, the pixel electrodes 224 to 244 and the connection electrodes 226 to 246 may be formed by patterning different material layers.

Figure 1E:
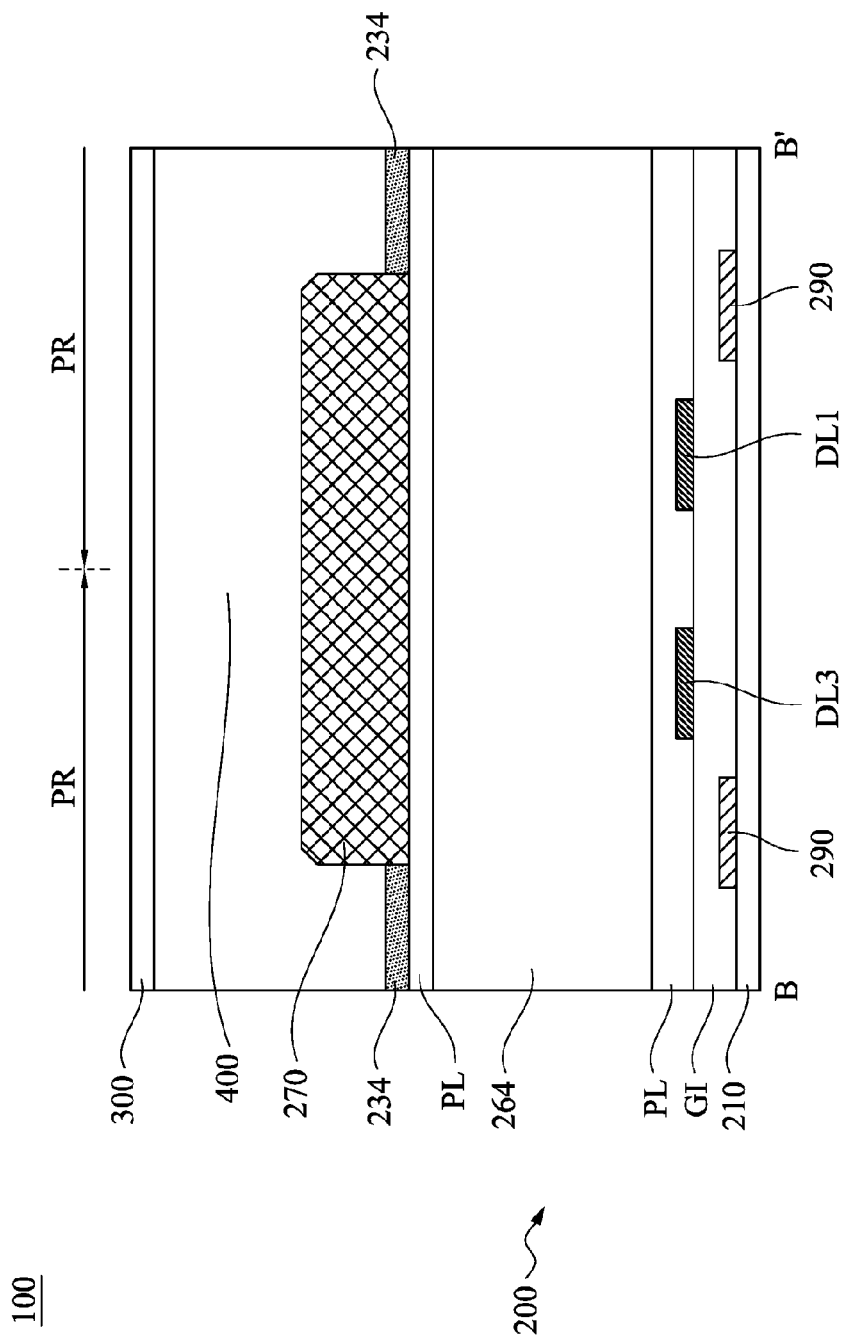
FIG. 1E is a schematic sectional view along a line 1E-1E of FIG. 1A.

FIG. 1E is a schematic sectional view along a line 1E-1E of FIG. 1A and FIG. 1C. Refer to FIG. 1A, FIG. 1C, and FIG. 1E at the same time. The light shielding layer 270 is provided between adjacent two pixel regions PR to cover the first data line DL1, the third data line DL3, and a gap therebetween, so as to preferably distinguish the two pixel regions PR from each other. Herein, a projection of the shield electrode 290 on the substrate 210 is at least partially located outside a projection of the light shielding layer 270 on the substrate 210, so as to increase a shielded region, and ensure that electric fields of the first data line DL1 and the third data line DL3 do not escape to affect liquid crystal arrangement.

Figure 2:
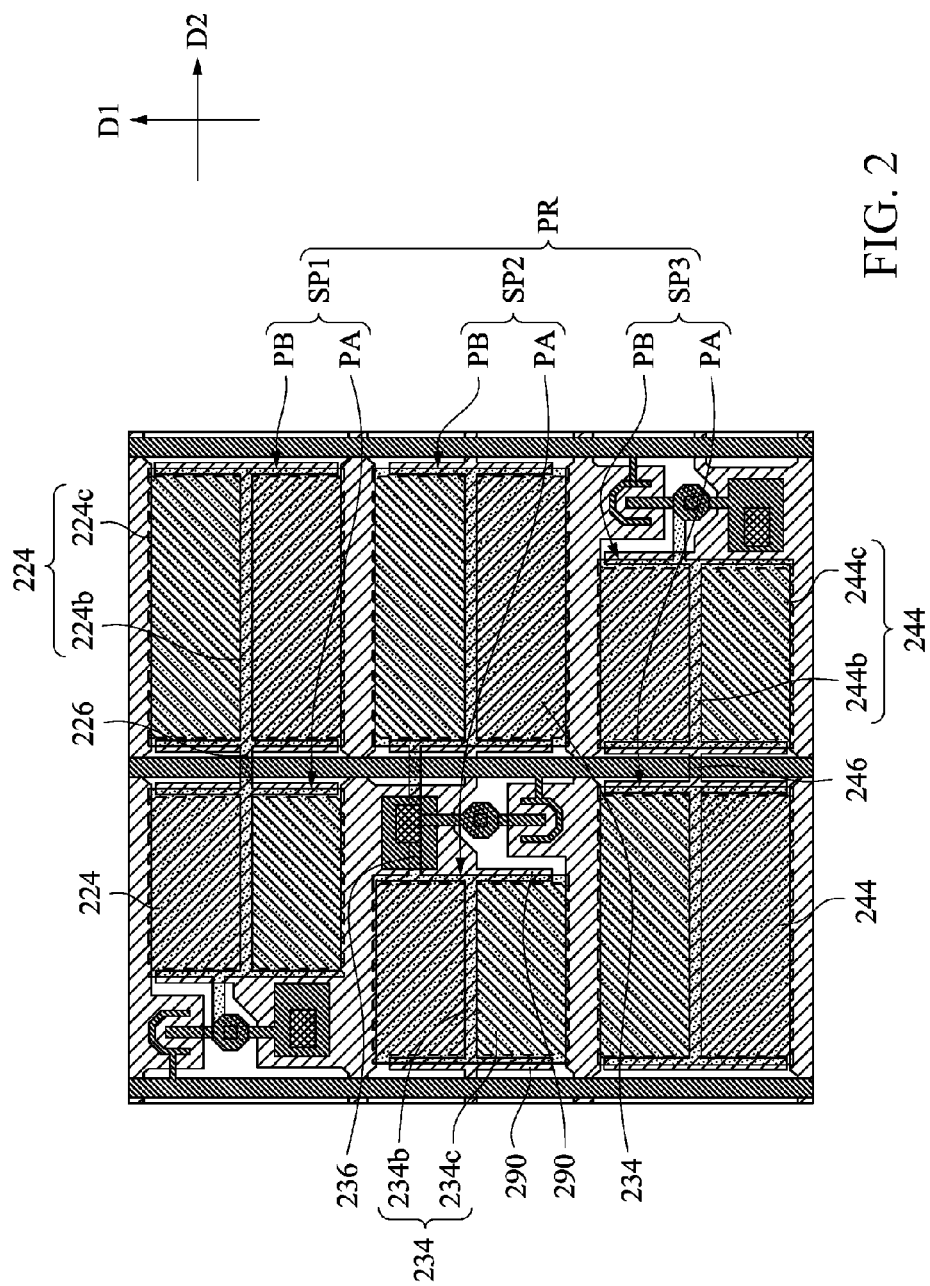
FIG. 2 is a schematic top view of a single pixel region according to another implementation manner of the present invention.

FIG. 2 is a schematic top view of a single pixel region PR according to another implementation manner of the present invention. The present implementation manner is similar to the implementation manner of FIG. 1B, and the difference lies in that: in the present implementation manner, pixel electrodes 224, 234, and 244 do not comprise first trunk electrodes 224a, 234a, and 244a (referring to FIG. 1B), and branch electrodes 224c, 234c, and 244c of the pixel electrodes 224, 234, and 244 have two extension directions.

In some implementation manners, to effectively control liquid crystal in a multi-domain manner, quantities of the pixel electrodes 224, 234, and 244 may be plural, and the pixel electrodes 224, 234, and 244 are distributed in different regions of the first sub-pixel region SP1, the second sub-pixel region SP2, and the third sub-pixel region SP3. In this case, the pixel electrodes 224, 234, and 244 may be designed not to comprise the first trunk electrodes 224a, 234a, and 244a (referring to FIG. 1B). In this way, even though when the substrate 210 bends along a second direction D2 and a black feather phenomenon may occur due to dislocation, in view of that the pixel electrodes 224, 234, and 244 do not comprise the first trunk electrodes 224a, 234a, and 244a, and a shield electrode 290 is designed to shield a dislocated region on one side of a first divided region PA and a second divided region PB, and therefore an area of the dislocated region may be reduced, to reduce an effect of the black feature phenomenon on visual effects.

Other details of the present implementation manner are approximately stated above, and are not described herein again.

Some implementation manners of the present invention provide an active element array substrate and a display panel using the same. A long edge of a sub-pixel is designed to be parallel to a long edge of a display panel, so that a region in which liquid crystal arrangement is disordered because upper and lower substrates are dislocated is reduced. In addition, in the present implementation manner, a first sub-pixel unit 220, a second sub-pixel unit 230, and a third sub-pixel unit 240 are supplied with respective operating voltages by means of a same gate signal and different data signals to present expected brightnesses. This practice may improve power supply time of each sub-pixel unit to ensure that an active element in each sub-pixel unit is sufficiently charged.

The present invention is disclosed through the foregoing plurality of implementation manners; however, these implementation manners are not intended to limit the present invention. Various changes and modifications made by persons of ordinary skill in the art without departing from the spirit and scope of the present invention shall fall within the protection scope of the present invention. The protection scope of the present invention is subject to the appended claims.

What is claimed is:

1. An active element array substrate, comprising:
   a substrate, comprising an active region and a peripheral region;
   a first data line disposed on said substrate extending along a first direction;
   a second data line disposed on said substrate extending along said first direction;
   a third data line disposed on said substrate extending along said first direction, wherein said second data line is between said first data line and said third data line;
   a first scan line disposed on said substrate extending along a second direction, wherein said second direction is different from said first direction;
   a second scan line disposed on said substrate extending along said second direction;
   a common electrode line disposed on said substrate extending along said second direction, wherein said common electrode line is between said first scan line and said second scan line;
   a first sub-pixel unit electrically connected to said first data line and said first scan line;
   a second sub-pixel unit electrically connected to said second data line and said second scan line; and
   a third sub-pixel unit electrically connected to said third data line and said second scan line.

2. The active element array substrate according to claim 1, wherein said first data line is distanced away from said third data line for a first length, said first scan line is distanced away from said common electrode line for a second length, and said first length is less than said second length.

3. The active element array substrate according to claim 1, wherein said first scan line and said second scan line extend to said peripheral region, and said first scan line is electrically connected to said second scan line.

4. The active element array substrate according to claim 3 further comprises a gate driver located in the peripheral region, wherein said gate driver comprises a first pin, and both said first scan line and said second scan line are electrically connected to said first pin.

5. The active element array substrate according to claim 1, wherein said first sub-pixel unit, said second sub-pixel unit, or said third sub-pixel unit comprises an active element and a first pixel electrode, and said first pixel electrode is electrically connected to said active element, and said first pixel electrode comprises:
   a first trunk electrode, which extends along said second direction; and
   a plurality of first branch electrodes electrically connected to said first trunk electrode and extending towards a plurality of different extension directions, wherein said extension directions are different from said first direction and said second direction.

6. The active element array substrate according to claim 5, wherein said first sub-pixel unit, said second sub-pixel unit, or said third sub-pixel unit further comprises:
   a second trunk electrode extending along said first direction and intersects with said first trunk electrode.

7. The active element array substrate according to claim 5, wherein each of said first sub-pixel unit, said second sub-pixel unit, or said third sub-pixel unit further comprises a second pixel electrode and a connection electrode, said first pixel electrode and said second pixel electrode are connected via said connection electrode, and said second pixel electrode comprises a second trunk electrode and a plurality of second branch electrodes; and said second data line is positioned between said first electrode and said second electrode.

8. The active element array substrate according to claim 7, wherein said plurality of first branch electrodes have a first extension direction and a second extension direction.

9. The active element array substrate according to claim 7, wherein said plurality of first branch electrodes and said plurality of second branch electrodes have a first extension direction, a second extension direction, a third extension direction, and a fourth extension direction.

10. The active element array substrate according to claim 1, wherein each of the first sub-pixel unit, the second sub-pixel unit, and the third sub-pixel unit comprises an active element and a pixel electrode, and the pixel electrode is electrically connected to the active element, and the active element array substrate further comprises:
 a color filter, comprising:
  a red photoresist, provided corresponding to the pixel electrode of the first sub-pixel region;
  a green photoresist, provided corresponding to the pixel electrode of the second sub-pixel region; and
  a blue photoresist, provided corresponding to the pixel electrode of the third sub-pixel region; and
 a light shielding layer, covering the active element.

11. A display panel, comprising:
 the active element array substrate according to claim 1;
 an opposite substrate;
 a liquid crystal layer, provided between the active element array substrate and the opposite substrate; and
 two vertical alignment layers, respectively provided between the liquid crystal layer and the active element array substrate, and between the liquid crystal layer and the opposite substrate.

12. The display panel according to claim 11, wherein the vertical alignment layers are formed by polymer stabilized materials.

13. The display panel according to claim 11, wherein each of the first sub-pixel unit, the second sub-pixel unit, and the third sub-pixel unit comprises an active element and a pixel electrode, and the pixel electrode is electrically connected to the active element, and the active element array substrate further comprises:
 a color filter, provided corresponding to the pixel electrode;
 a light shielding layer, provided corresponding to the active element; and
 at least one spacer, provided on the color filter, wherein a top end of the spacer is connected to the opposite substrate.

14. The display panel according to claim 11, wherein the substrate of the active element array substrate and the opposite substrate bend along the second direction.

15. The display panel according to claim 11, wherein each of the first sub-pixel region, the second sub-pixel region, and the third sub-pixel region has a first length in the first direction and has a second length in the second direction, and the first length is less than the second length.

* * * * *